(12) United States Patent
Gaska et al.

(10) Patent No.: US 9,793,367 B2
(45) Date of Patent: Oct. 17, 2017

(54) OHMIC CONTACT TO SEMICONDUCTOR

(71) Applicant: Sensor Electronic Technology, Inc., Columbia, SC (US)

(72) Inventors: Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/955,504

(22) Filed: Dec. 1, 2015

(65) Prior Publication Data

US 2016/0093702 A1    Mar. 31, 2016

Related U.S. Application Data

(63) Continuation of application No. 13/296,581, filed on Nov. 15, 2011, now Pat. No. 9,263,538.

(60) Provisional application No. 61/413,630, filed on Nov. 15, 2010.

(51) Int. Cl.
| | | |
|---|---|---|
| H01L 29/45 | (2006.01) | |
| H01L 33/38 | (2010.01) | |
| H01L 33/40 | (2010.01) | |
| H01L 21/285 | (2006.01) | |
| H01L 29/15 | (2006.01) | |
| H01L 29/20 | (2006.01) | |
| H01L 29/205 | (2006.01) | |
| H01L 29/417 | (2006.01) | |
| H01L 33/06 | (2010.01) | |
| H01L 33/32 | (2010.01) | |

(52) U.S. Cl.
CPC ...... *H01L 29/452* (2013.01); *H01L 21/28575* (2013.01); *H01L 29/155* (2013.01); *H01L 29/2003* (2013.01); *H01L 29/205* (2013.01); *H01L 29/417* (2013.01); *H01L 33/06* (2013.01); *H01L 33/32* (2013.01); *H01L 33/38* (2013.01); *H01L 33/40* (2013.01)

(58) Field of Classification Search
CPC ...... H01L 29/45; H01L 29/452; H01L 29/454
See application file for complete search history.

(56) References Cited

U.S. PATENT DOCUMENTS

| | | |
|---|---|---|
| 6,064,082 A | 5/2000 | Kawai et al. |
| 6,897,137 B2 | 5/2005 | Nguyen et al. |
| 6,943,377 B2 | 9/2005 | Gaska et al. |
| 7,170,111 B2 | 1/2007 | Saxler |

(Continued)

FOREIGN PATENT DOCUMENTS

| | | |
|---|---|---|
| JP | 2001156327 A | 6/2001 |
| WO | 2008069482 A1 | 6/2008 |

OTHER PUBLICATIONS

Kim, S., U.S. Appl. No. 13/296,581, Notice of Allowance, Oct. 7, 2015, 15 pages.

(Continued)

*Primary Examiner* — Stephen W Smoot
*Assistant Examiner* — Sun M King
(74) *Attorney, Agent, or Firm* — Labatt, LLC (57) ABSTRACT

An ohmic contact to a semiconductor layer including a heterostructure barrier layer and a metal layer adjacent to the heterostructure barrier layer is provided. The heterostructure barrier layer can form a two dimensional free carrier gas for the contact at a heterointerface of the heterostructure barrier layer and the semiconductor layer. The metal layer is configured to form a contact with the two dimensional free carrier gas.

21 Claims, 8 Drawing Sheets

(56) References Cited

U.S. PATENT DOCUMENTS

| | | |
|---|---|---|
| 7,554,123 B2 | 6/2009 | Gaska et al. |
| 7,655,962 B2 | 2/2010 | Simin et al. |
| 7,674,666 B2 | 3/2010 | Simin et al. |
| 7,700,974 B2 | 4/2010 | Nguyen et al. |
| 2007/0132037 A1 | 6/2007 | Hoshi et al. |
| 2008/0203446 A1 | 8/2008 | Simin et al. |
| 2009/0173999 A1 | 7/2009 | Gaska et al. |
| 2010/0156442 A1 | 6/2010 | Simin et al. |
| 2010/0156475 A1 | 6/2010 | Simin et al. |

OTHER PUBLICATIONS

Kim, S., U.S. Appl. No. 13/296,581, Office Action 2, Jun. 23, 2015, 25 pages.

Kim, S., U.S. Appl. No. 13/296,581, Office Action 1, Nov. 24, 2014, 19 pages.

Adivarahan, V. et al., "High-efficiency 269 nm emission deep ultraviolet light-emitting diodes," Applied Physics Letters, vol. 84, No. 23, Jun. 7, 2004, pp. 4762-4764.

Adivarahan, V. et al., "Very-low-specific-resistance Pd/Ag/Au/Ti/Au alloyed ohmic contact to p GaN for high-current devices," Applied Physics Letters, vol. 78, No. 18, Apr. 30, 2001, pp. 2781-2783.

Chitnis, A. et al., "Improved performance of 325-nm emission AlGaN ultraviolet lightemitting diodes," Applied Physics Letters, vol. 82, No. 16, Apr. 21, 2003, pp. 2565-2567.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Goepfert, I.D. et al., "Experimental and theoretical study of acceptor activation and transport properties in p-type $Al_xGa_{1-x}N$/GaN superlattices," Journal of Applied Physics, vol. 88, No. 4, Aug. 15, 2000, pp. 2030-2038.

Kawakami, Improved electrical properties in Al Ga N/Ga N heterostructures using Al N/Ga N superlattice as a quasi-AlGaN barrier, Applied Physics Letters, vol. 90, 242112, 2007.

Kim, International application No. PCT/US2011/060729, International Search Report and Written Opinion of the International Searching Authority, May 15, 2012, 10 pages.

Kozodoy, P. et al., "Enhanced Mg doping efficiency in $Al_{0.2}Ga_{0.8}N$/GaN superlattices," Applied Physics Letters, vol. 74, No. 24, Jun. 14, 1999, pp. 3681-3683.

Kozodoy, P. et al., "Polarization-enhanced Mg doping of AlGaN/GaN superlattices," Applied Physics Letters, vol. 75, No. 16, Oct. 18, 1999, pp. 2444-2446.

Nishida, T. et al., "Efficient and high-power AlGaN-based ultraviolet light-emitting diode grown on bulk GaN," Applied Physics Letters, vol. 79, No. 6, Aug. 6, 2001, pp. 711-712.

Peng, H. et al., "Ultraviolet light-emitting diodes operating in the 340 nm wavelength range and application to time-resolved fluorescence spectroscopy," Applied Physics Letters, vol. 85, No. 8, Aug. 23, 2004, pp. 1436-1438.

Qiad et al., "Ta-based interface ohmic contacts to AlGaN/GaN heterostructures," Journal of Applied Physics, vol. 89, No. 10, May 15, 2011, pp. 5543-5546.

Saxler, A. et al., "Aluminum gallium nitride short-period superlattices doped with magnesium," Applied Physics Letters, vol. 74, No. 14, Apr. 5, 1999, pp. 2023-2025.

Shur, M.S. et al., "Accumulation hole layer in p-GaN/AlGaN heterostructures," Applied Physics Letters, vol. 76, No. 21, May 22, 2000, pp. 3061-3063.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Wang, T. et al., "1 mW AlInGaN-based ultraviolet light-emitting diode with an emission wavelength of 348 nm grown on sapphire substrate," Applied Physics Letters, vol. 81, No. 14, Sep. 30, 2002, pp. 2508-2510.

Yasan, A. et al., "4.5 mW operation of AlGaN-based 267 nm deep-ultraviolet lightemitting diodes," Applied Physics Letters, vol. 83, No. 23, Dec. 8, 2003, pp. 4701-4703.

Zhang, et al., "AlGaN multiple-quantum-well-based, deep ultraviolet lightemitting diodes with significantly reduced long-wave emission," Applied Physics Letters, vol. 83, No. 17, Oct. 27, 2003, pp. 3456-3458.

Zhang, et al., "Milliwatt power deep ultraviolet light-emitting diodes over sapphire with emission at 278 nm," Applied Physics Letters, vol. 81, No. 26, Dec. 23, 2002, pp. 4910-4912.

OHMIC CONTACT TO SEMICONDUCTOR

REFERENCE TO RELATED APPLICATIONS

The present patent application is a continuation of U.S. application Ser. No. 13/296,581, entitled "Ohmic Contact to Semiconductor" which was filed on 15 Nov. 2011, now pending, which claims the benefit of U.S. Provisional Application No. 61/413,630, entitled "Ohmic Contact to Semiconductors," which was filed on 15 Nov. 2010, each of which is hereby incorporated by reference in its entirety to provide continuity of disclosure.

TECHNICAL FIELD

The disclosure relates generally to contacts to semiconductors, and more particularly, to an ohmic contact to a semiconductor, such as a nitride-based semiconductor.

BACKGROUND ART

A challenge in developing high power III-V material-based semiconductor devices, such as light emitting diodes (LEDs), laser diodes (LDs), bipolar junction transistors (BJTs), and heterojunction bipolar transistors (HBTs), is the development of an ohmic contact that has both a low specific resistance and a high current carrying capability. For example, the challenge to manufacture a low resistance ohmic contact to n-type material is particularly important for deep ultraviolet LEDs made from group III-nitride materials, such as Aluminum Gallium Nitride (AlGaN) or Aluminum Gallium Indium Nitride (AlGaInN), which include a high molar fraction of aluminum. Similarly, the challenge for manufacturing quality contacts to p-type nitride semiconductors is important for all nitride-based LEDs since a relatively low p-doping (e.g., less than $1 \times 10^{18}$ cm$^{-3}$) in p-type GaN, which is achievable either by metalorganic chemical vapor deposition (MOCVD) or molecular beam epitaxy (MBE), makes the formation of such p-type ohmic contacts difficult.

Magnesium (Mg), with a room-temperature activation energy as high as two hundred fifty meV, which increases almost linearly with an increase of the Al molar fraction, is a commonly used acceptor for p-type GaN semiconductors as well as AlGaN and AlGaInN semiconductors with a high molar fraction of Al, such as those used in deep ultraviolet LEDs. For example, a Mg-doped AlGaN/GaN short period superlattice (SPSL), with the period of the superlattice being very small (e.g., below four nanometers), has been proposed to replace a p-type AlGaN semiconductor. In this case, since minibands are formed in the SPSL, vertical conduction of the p-type SPSL should not be degraded compared to that of the AlGaN semiconductor. Several approaches have proposed using Mg-doped AlGaN/GaN SPSL in the growth of 340-350 nanometer ultraviolet LEDs. Mg-doped AlGaN-based large period superlattices (LPSL), with the period of the superlattice being relatively large (e.g., larger than fifteen nanometers), also have been proposed. However, to date, these structures have exhibited a reduced vertical conductivity.

In another approach, a p-type GaN/p-type AlGaN single heterostructure has been used to achieve hole accumulation at an interface. Since such a heterostructure only includes one barrier for hole transportation, the vertical conductivity can be enhanced compared to the LPSL approach due to hole accumulation at the heterointerface, field assisted tunneling, as well as thermal emission. Several approaches for manufacturing deep UV LEDs have incorporated such a heterostructure for hole injection layers.

P-type contact resistivity of $1.1 \times 10^{-6}$ ohm-cm$^2$ has been achieved. In particular, a Palladium/Silver/Gold/Titanium/Gold (Pd/Ag/Au/Ti/Au) metallic contact was used under high-current operation for a vertically conducting GaN/InGaN multiple quantum well (MQW) LED structure grown on a Silicon Carbide (SiC) substrate. However, ohmic contacts to p-type nitrides with a high Al composition remain a problem.

To achieve a low n-type contact resistance in a nitride-based device, several contact metals and a relatively high annealing temperature are generally used. To this extent, Al can be used as a contact metal because of its relatively low melting point of approximately 660 degrees Celsius. Furthermore, Titanium (Ti) or Chromium (Cr) can be used as the first layer of the contact due to their low metal work function to nitrides. Specific examples include Ti/Al/Ti/Gold (Au) or Ti/Al/Nickel (Ni)/Au, with thicknesses from five nanometers to five microns and which are annealed at 400 degrees Celsius or higher temperatures. Another approach reverses the order of the Ti and Al, and forms an Al/Ti-based contact to an n-type GaN semiconductor, which includes Al/Ti/Platinum (Pt)/Au and which is annealed at temperatures between 400 and 600 degrees Celsius. Still other approaches form a Cr/Al-based contact to an n-type GaN semiconductor, which include various metal configurations, such as Cr/Al/Cr/Au, Cr/Al/Pt/Au, Cr/Al/Pd/Au, Cr/Al/Ti/Au, Cr/Al/Cobalt (Co)/Au, and Cr/Al/Ni/Au.

Contact reliability also can be a problem. For example, to date, Ti/Al-based n-type contacts for ultraviolet LEDs emitting 265 nanometer and shorter wavelengths have not been shown to be very reliable.

SUMMARY OF THE INVENTION

Aspects of the invention provide an ohmic contact to a semiconductor layer including a heterostructure barrier layer and a metal layer adjacent to the heterostructure barrier layer. The heterostructure barrier layer can form a two dimensional free carrier gas for the contact at a heterointerface of the heterostructure barrier layer and the semiconductor layer. The metal layer is configured to form a contact with the two dimensional free carrier gas.

A first aspect of the invention provides an ohmic contact to a semiconductor layer, the ohmic contact comprising: a heterostructure barrier formed on a surface of the semiconductor layer, wherein the heterostructure barrier layer forms a two dimensional free carrier gas for the contact at a heterointerface of the heterostructure barrier layer and the semiconductor layer, the two dimensional free carrier gas extending along the surface of the semiconductor layer beyond a perimeter of the heterostructure barrier layer; and a metal layer formed on the heterostructure barrier layer, wherein the metal layer forms a contact with the two dimensional free carrier gas, wherein the metal layer extends completely over a top surface and at least one side surface of the heterostructure barrier layer.

A second aspect of the invention provides a structure comprising: a semiconductor layer; and a set of ohmic contact structures, each ohmic contact structure in the set of ohmic contact structures comprising: a heterostructure barrier layer formed on a surface of the semiconductor layer, wherein the heterostructure barrier layer forms a two dimensional free carrier gas for the contact structure at a heterointerface of the heterostructure barrier layer and the semiconductor layer, the two dimensional free carrier gas extending along the surface of the semiconductor layer beyond a perimeter of the heterostructure barrier layer; and a metal layer located formed on the heterostructure barrier layer, wherein the metal layer forms a contact with the two dimensional free carrier gas, wherein the metal layer extends completely over a top surface and at least one side surface of the heterostructure barrier layer.

A third aspect of the invention provides a method comprising: forming an ohmic contact to a semiconductor layer, the ohmic contact comprising: a heterostructure barrier formed on a surface of the semiconductor layer, wherein the heterostructure barrier layer forms a two dimensional free carrier gas for the contact at a heterointerface of the heterostructure barrier layer and the semiconductor layer, the two dimensional free carrier gas extending along the surface of the semiconductor layer beyond a perimeter of the heterostructure barrier layer; and a metal layer formed on the heterostructure barrier layer, wherein the metal layer forms a contact with the two dimensional free carrier gas, wherein the metal layer extends completely over a top surface and at least one side surface of the heterostructure barrier layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide an ohmic contact to a semiconductor layer including a heterostructure barrier layer and a metal layer adjacent to the heterostructure barrier layer. The heterostructure barrier layer can form a two dimensional free carrier gas for the contact at a heterointerface of the heterostructure barrier layer and the semiconductor layer. The metal layer is configured to form a contact with the two dimensional free carrier gas. An ohmic contact configured as described herein can comprise one or more improved operating characteristics than prior art ohmic contacts, including, for example, a lower specific resistance, a higher current carrying ability, and/or the like. As used herein, unless otherwise noted, the term "set" means one or more (i.e., at least one) and the phrase "any solution" means any now known or later developed solution.

Figure 1:
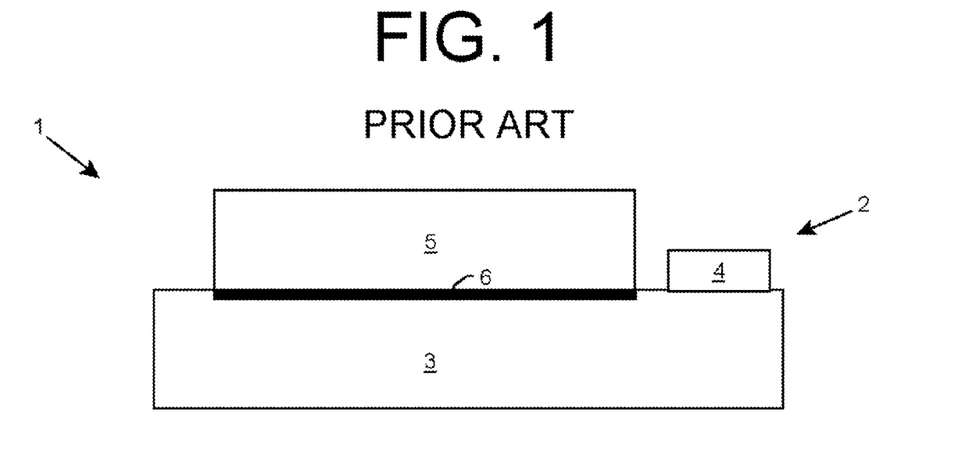
FIG. 1 shows a structure including an ohmic contact according to the prior art.

Turning to the drawings, FIG. 1 shows a structure 1 including an ohmic contact 2 according to the prior art. As illustrated, the structure 1 includes a semiconductor layer 3 and a heterostructure barrier layer 5 located directly on a first surface of the semiconductor layer 3. A two dimensional free carrier gas 6 is formed at a heterointerface of the heterostructure barrier layer 5 and the semiconductor layer 3 due to the properties of the structure 1 and the interface. The ohmic contact 2 comprises a metal layer 4 located adjacent to the heterostructure barrier layer 5 directly on the first surface of the semiconductor layer 3, which makes a contact with the two dimensional free carrier gas 6.

Figure 2:
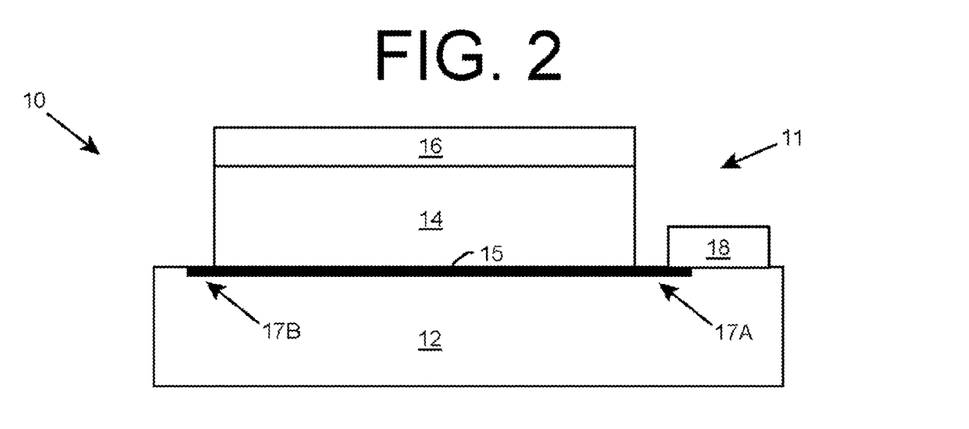
FIG. 2 shows a first illustrative structure including an ohmic contact according to an embodiment

FIG. 2 shows a first illustrative structure 10 including an ohmic contact 11 to a semiconductor layer 12 according to an embodiment. The ohmic contact 11 includes a heterostructure barrier layer 14, a layer 16, and a metal layer 18. In this embodiment, formation of a two dimensional free carrier gas 15 for the ohmic contact 11 is induced by heterostructure barrier layer 14 in a manner which results in extensions 17A, 17B of the two dimensional free carrier gas 15 beyond the location of the heterostructure barrier layer 14 on the surface of the semiconductor layer 12. In this manner, the metal layer 18 touches an extension 17A of the two dimensional free carrier gas 15 in a region of the semiconductor layer 12 beyond the heterostructure barrier layer 14.

The two dimensional free carrier gas 15 can be induced by, for example, a fringing capacitance. To this extent, layer 16 and semiconductor layer 12 can comprise conductors, while heterostructure barrier layer 14 can comprise a dielectric, thereby forming a capacitor with layers 12, 14, and 16. In an embodiment, the ohmic contact 11 includes the layer 16 to form the two dimensional free carrier gas 15, e.g., due to its properties, a bias applied to layer 16, and/or the like. When the ohmic contact 11 is incorporated into a circuit, layer 16 can remain floating or can be biased with respect to the metal layer 18 and/or semiconductor 12. In an embodiment, layer 16 comprises a doped semiconductor layer, which can have a smaller bandgap than that of the heterostructure barrier layer 14. In a more particular illustrative embodiment, semiconductor layer 12 can comprise an AlGaN layer, heterostructure barrier layer 14 can comprise an AlGaN layer having a higher molar fraction of Al than the Al molar fraction in the semiconductor layer 12, and layer 16 can comprise a highly doped GaN layer.

In another embodiment, layer 16 comprises a second metal layer. In this case, layer 16 can comprise the same metal as the metal layer 18 or a different metal. During operation of a device including ohmic contact 11, an electrical connection can be made to both the metal layer 18 and the second metal layer 16. Alternatively, layer 16 could be electrically biased with respect to the metal layer 18 to, for example, induce additional carriers into the two dimensional free carrier gas 15.

In an embodiment, the heterostructure barrier layer 14 is selectively located on a portion of the semiconductor layer 12, and included in the device structure 10 only as part of the ohmic contact 11. In this embodiment, the resulting two dimensional free carrier gas 15 also is isolated to the corresponding ohmic contact 11. In an embodiment, the heterostructure barrier layer 14 has a wider band gap than the semiconductor layer 12. Furthermore, the semiconductor layer 12 and the heterostructure barrier layer 14 can comprise distinct polarizations. In this case, the two dimensional free carrier gas 15 can be created due to the polarization differences between the semiconductor layer 12 and the heterostructure barrier layer 14. The metal layer 18 can be located on either a source or a drain side of the heterostructure barrier layer 14, which can be selected based on, for example, the device functionality to be provided by the ohmic contact 11.

Figure 3:
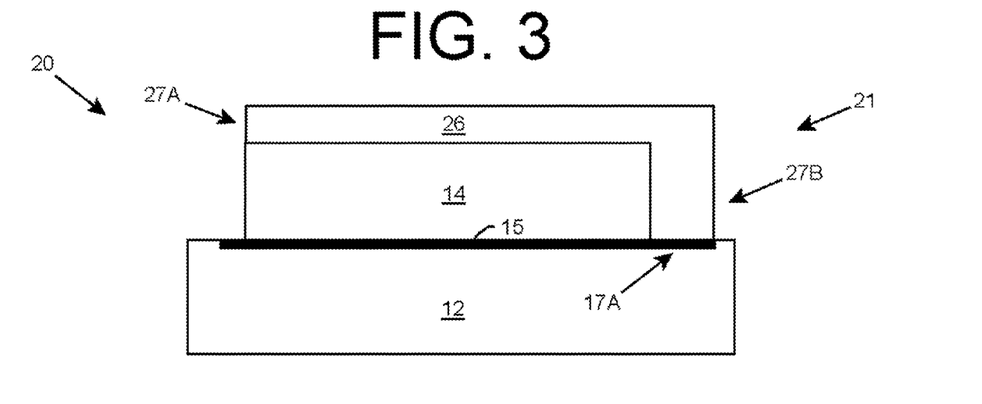
FIG. 3 shows a second illustrative structure including an ohmic contact according to an embodiment.

It is understood that the ohmic contact 11 and the corresponding structure 10 can comprise various alternative configurations. For example, FIG. 3 shows a second illustrative structure 20 including an ohmic contact 21 according to an embodiment. In this case, the ohmic contact 21 includes a metal layer 26 having a first portion 27A located on the heterostructure barrier layer 14 and a second portion 27B extending along and contacting a side of the heterostructure barrier layer 14 and connecting with the first portion 27A. The second portion 27B can be located on the semiconductor layer 12 such that it touches an extension 17A of the two dimensional free carrier gas 15.

Figure 4:
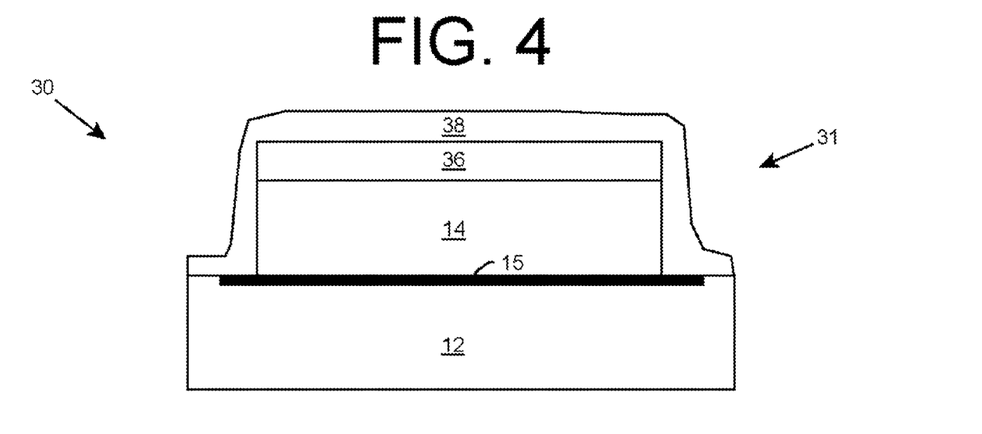
FIG. 4 shows a third illustrative structure including an ohmic contact according to an embodiment.

FIG. 4 shows a third illustrative structure 30 including an ohmic contact 31 according to an embodiment. In this case, the ohmic contact 31 includes a layer 36, which is entirely located on the heterostructure barrier layer 14 and can be configured similar to the layer 16 shown and described with reference to FIG. 2. Furthermore, the structure 30 includes a second layer 38 covering an entirety of the layers 14, 36 and contacting extensions 17A, 17B of the two dimensional free carrier gas 15 on both sides of the heterostructure barrier layer 14. In an embodiment, layer 38 can comprise a metal layer, while layer 36 comprises a conductor, such as a doped semiconductor layer. In another embodiment, layer 38 can comprise a passivation layer formed of a high dielectric strength insulating material, which increases a breakdown voltage of the ohmic contact 31. A passivation layer 38 can be formed of any type of insulating material, such as a dielectric. Illustrative materials include, for example, silicon nitride (SiN), silicon dioxide ($SiO_2$), bisbenzocyclobutene, and/or the like. While shown in conjunction with ohmic contact 31, it is understood that a passivation layer can be included in any of the structure and/or ohmic contact configurations described herein.

Figure 5:
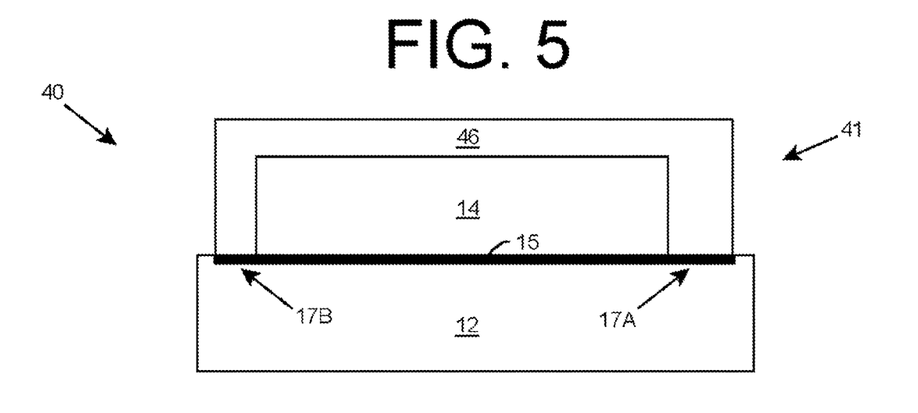
FIG. 5 shows a fourth illustrative structure including an ohmic contact according to an embodiment.

In an embodiment, the ohmic contact includes a metal layer that touches extensions of the two-dimensional free carrier gas on opposing sides, such as the source and drain sides, of the heterostructure barrier layer. For example, FIG. 5 shows a fourth illustrative structure 40 including an ohmic contact 41 according to an embodiment. The ohmic contact 41 comprises a contiguous metal layer 46 that includes portions directly adjacent to source and drain sides of the heterostructure barrier layer 14 as well as a portion directly on the heterostructure barrier layer 14. In this configuration, the metal layer 46 contacts the extensions 17A, 17B of the two-dimensional free carrier gas 15 on opposing sides of the heterostructure barrier layer 14.

Figure 6:
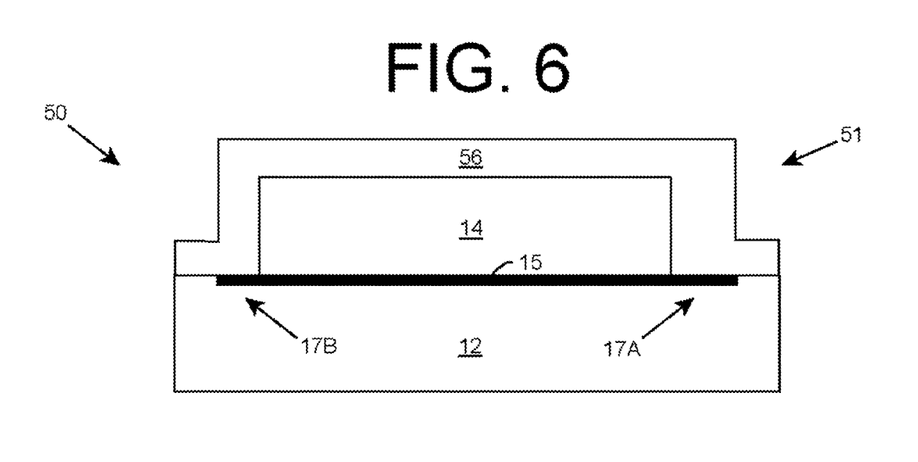
FIG. 6 shows a fifth illustrative structure including an ohmic contact according to an embodiment.

Similarly, FIG. 6 shows a fifth illustrative structure 50 including an ohmic contact 51 according to an embodiment. The ohmic contact 51 comprises a contiguous metal layer 56 where the portions of the metal layer 56 on the source and drain sides of the heterostructure barrier layer 14 are configured to extend beyond the two-dimensional free carrier gas 15 formed at the heterointerface of the semiconductor layer 12 and the heterostructure barrier layer 14. While the metal layer 56 is shown extending beyond the two-dimensional free carrier gas 15 on both sides of the heterostructure barrier layer 14, it is understood that the metal layer 56 can be configured such that the metal layer 56 on only one of the sides of the metal layer 56 contacts and/or extends beyond the extensions 17A, 17B of the two-dimensional free carrier gas 15.

Figure 7:
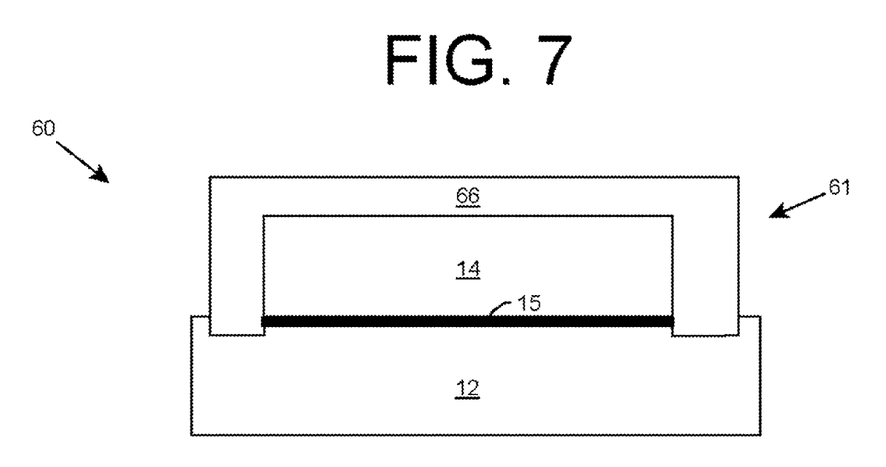
FIG. 7 shows a sixth illustrative structure including an ohmic contact according to an embodiment.

FIG. 7 shows a sixth illustrative structure 60 including an ohmic contact 61 according to an embodiment. The ohmic contact 61 comprises a contiguous metal layer 66 where the portions of the metal layer 66 on opposing sides of the heterostructure barrier layer 14 are diffused into the semiconductor layer 12. In this case, the metal layer 66 contacts the two-dimensional free carrier gas 15 on both sides of the heterostructure barrier layer 14 due to the metal diffusion into the semiconductor layer 12, and the two-dimensional free carrier gas 15 is entirely contained under the heterostructure barrier layer 14.

The various illustrative heterostructures and ohmic contacts shown in FIGS. 1-7 can be formed using any type of materials, in which the material for heterostructure barrier layer 14 comprises a wider band gap than the material for semiconductor layer 12 and/or the material for layer 16. In an embodiment, semiconductor layer 12 and heterostructure barrier layer 14 are each formed of III-V-based materials. In a more particular embodiment, semiconductor layer 12, heterostructure barrier layer 14, and/or layer 16 are each formed of group III nitride-based material compositions. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. Each of the metal layers described herein can be formed of any of various metals/metal combinations including, for example, Nickel, Aluminum, and/or Gold, a Palladium/Silver/Gold/Titanium/Gold (Pd/Ag/Au/Ti/Au) combination, a Ti/Al-based combination, an Al/Ti-based combination, a Cr/Al-based combination, a Cr/Ti/Al-based combination, and/or the like, each of which can be annealed.

Furthermore, the composition of semiconductor layer 12 and/or heterostructure barrier layer 14 can be substantially uniform or graded. In an illustrative embodiment, the heterostructure barrier layer 14 comprises AlInGaN, with the Al and/or In composition varying across the layer in a direction perpendicular to the surface of the semiconductor layer 12. In a more particular illustrative embodiment, the heterostructure barrier layer 14 can comprise $Al_XGa_{1-X}N$, where X changes as a function of distance from the heterointerface between the semiconductor layer 12 and the heterostructure barrier layer 14. In an embodiment, the graded composition provides a low energy gap adjacent to the two-dimensional free carrier gas 15 and an increasingly higher energy gap as the composition moves away from the two-dimensional free carrier gas 15. The graded composition(s) can be included to, for example, reduce stress, increase a density of the two-dimensional free carrier gas 15, and/or the like. Similarly, semiconductor layer 12 and/or heterostructure barrier layer 14 can comprise a superlattice including a plurality of periods. In this case, the composition and/or width of each period can vary periodically or aperiodically from period to period. In an embodiment, one or both of the semiconductor layer 12 and the heterostructure barrier layer 14 comprises a short period superlattice, which can be configured to reduce stress, and/or the like.

The various ohmic contacts described herein can be utilized to form an n-type contact or a p-type contact. To this extent, the two dimensional free carrier gas 15 can comprise a two dimensional electron gas (for an n-type contact) or a two dimensional hole gas (for a p-type contact). Semiconductor layer 12, heterostructure barrier layer 14, and/or layer 16 also can be doped with a dopant during formation or can be undoped. When doped, a layer 12, 14, 16 can have delta doping and/or bulk doping. The dopant and/or type of doping can be selected based on the material composition of the corresponding layer and the desired functionality to be provided by adding the dopant. For example, a different dopant can be selected based on whether the material composition is a p-type composition (in which the dopant can be selected to add acceptor atoms) or an n-type composition (in which the dopant can be selected to add donor atoms). In an embodiment, heterostructure barrier layer 14 comprises a doped semiconductor layer (with a constant or graded composition) having delta doping exclusively or in addition to bulk doping. Illustrative dopants for p-type group III nitride materials include magnesium (Mg) and beryllium (Be), while illustrative dopants for n-type group III nitride materials comprise silicon (Si), carbon (C) on Ga site, oxygen (O) on N site and nitrogen vacancy ($V_N^{3+}$).

Figure 8:
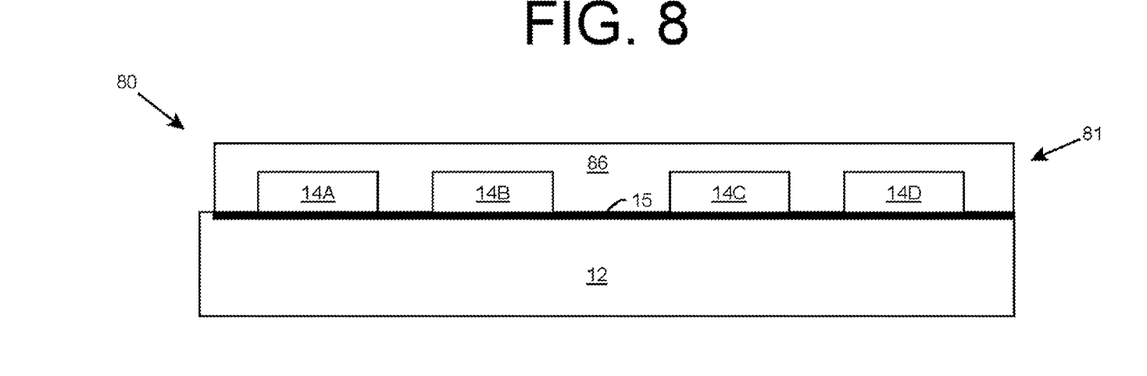
FIG. 8 shows a first illustrative structure including a patterned ohmic contact according to an embodiment.

Multiple instances of one or more components of an ohmic contact described herein can be combined to form a patterned structure. For example, FIG. 8 shows a first illustrative structure 80 including a patterned ohmic contact 81 according to an embodiment. The patterned ohmic contact 81 includes a metal layer 86 that covers at least three sides (e.g., source, drain, and top sides) of multiple heterostructure barrier layers 14A-14D. In this case, the patterned ohmic contact 81 includes multiple contact regions with the two dimensional free carrier gas 15 formed at the heterointerface of the barrier layers 14A-14D with the semiconductor layer 12, which can provide for an improved contact over a single contact region.

Figure 9:
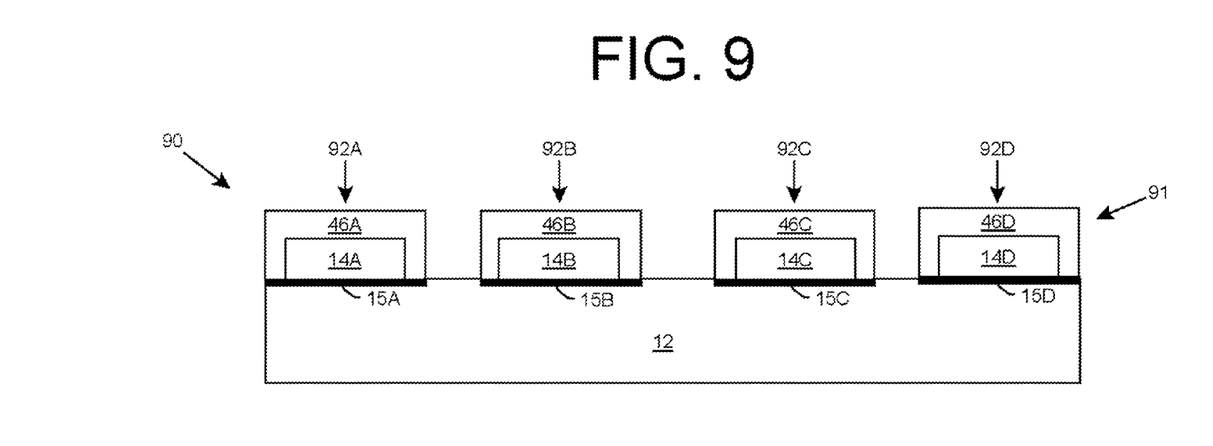
FIG. 9 shows a second illustrative structure including a patterned ohmic contact according to an embodiment.

FIG. 9 shows a second illustrative structure 90 including a patterned ohmic contact 91 according to an embodiment. Ohmic contact 91 includes a plurality of ohmic contact sub-structures 92A-92D, each of which includes a heterostructure barrier layer 14A-14D forming a two dimensional free carrier gas 15A-15D, respectively, at the heterointerface with the semiconductor layer 12, and a corresponding metal layer 46A-46D. In this case, the ohmic contact 91 includes a plurality of separately formed and distinct regions of two dimensional free carrier gas 15A-15D. While the ohmic contact 91 is shown including four sub-structures 92A-92D, each of which is configured similar to the ohmic contact 41 shown in FIG. 5, it is understood that an ohmic contact can include any number of sub-structures, each of which can be configured according to any embodiment of the ohmic contact described herein.

Figure 10:
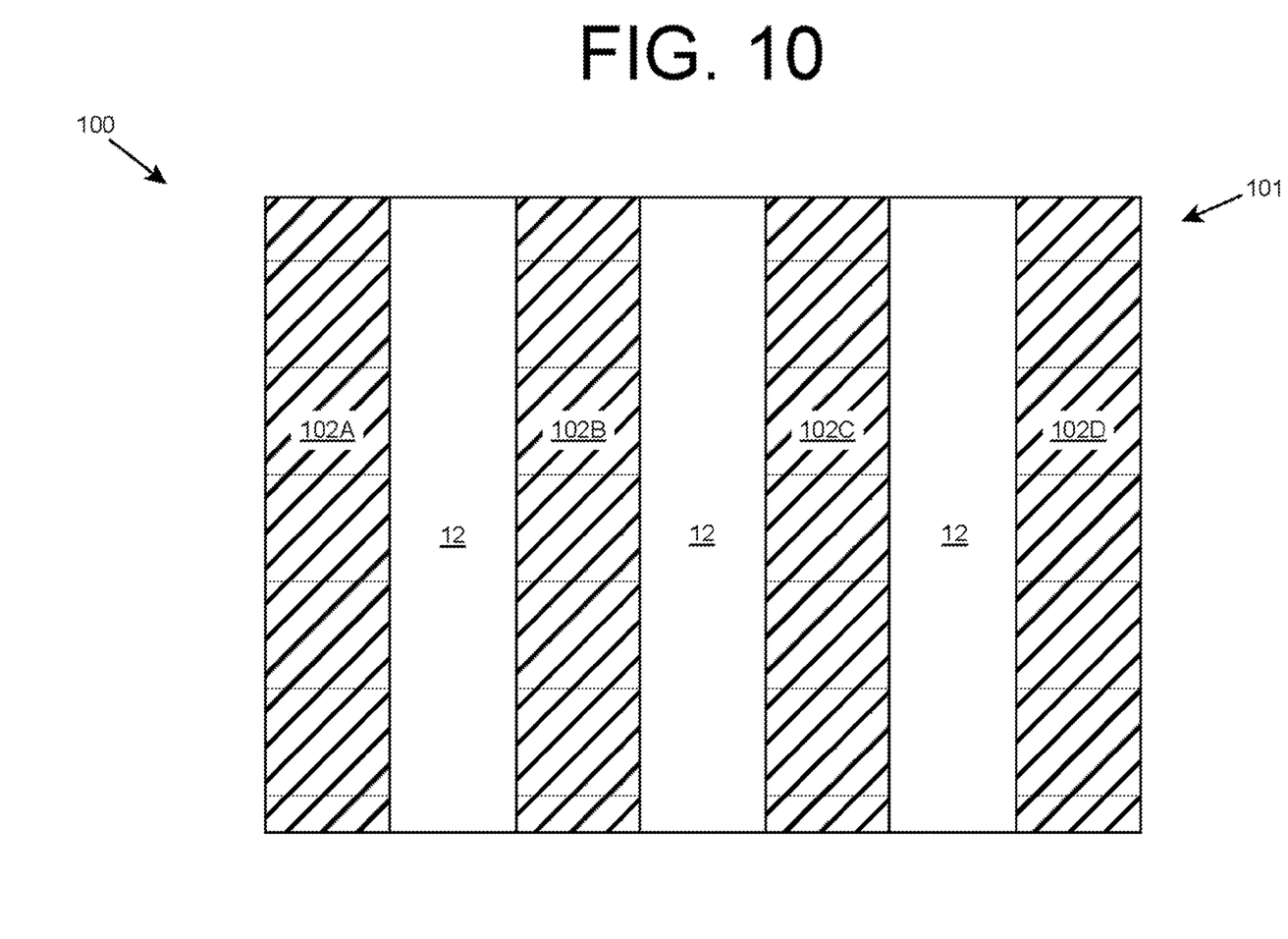
FIG. 10 shows a third illustrative structure including a patterned ohmic contact according to an embodiment.
Figure 11:
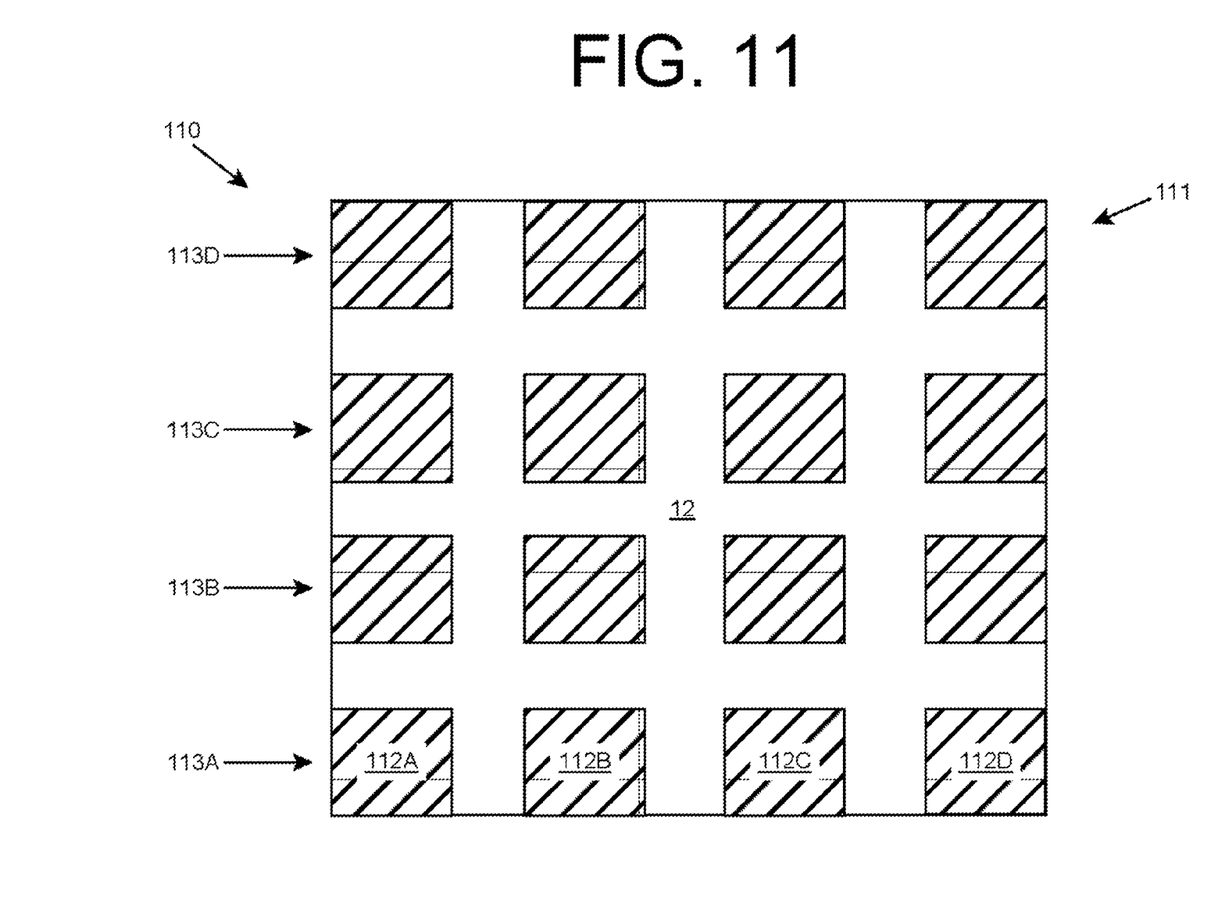
FIG. 11 shows a fourth illustrative structure including a patterned ohmic contact according to an embodiment.

Furthermore, an embodiment of the invention provides a patterned structure forming a semi-transparent ohmic contact, a Bragg reflector, and/or the like. For example, a periodic pattern of the sub-structures 92A-92D of ohmic contact 91 can allow for transparency, which can enable formation of a transparent contact (e.g., a p-type contact). Such a pattern can form a Bragg reflector. To this extent, FIG. 10 shows a third illustrative structure 100 including a patterned ohmic contact 101 according to an embodiment. Patterned ohmic contact 101 comprises a plurality of sub-structures 102A-102D arranged to form a striped pattern on the semiconductor layer 12. Each sub-structure 102A-102D can comprise any embodiment of the ohmic contact described herein. Similarly, FIG. 11 shows a fourth illustrative structure 110 including a patterned ohmic contact 111 according to an embodiment. Patterned ohmic contact 111 is shown including four rows of sub-structures 113A-113D, each of which includes four sub-structures, such as sub-structures 112A-112D of the row of sub-structures 113A. Each sub-structure 112A-112D can comprise any embodiment of the ohmic contact described herein.

The structures described herein can be manufactured using any solution. For example, a base structure including a semiconductor layer 12 can be obtained using any solution (e.g., purchased, grown, deposited, or otherwise formed, etc.). A surface of the semiconductor layer 12 on which the ohmic contact will be formed can be prepared, e.g., by polishing, chemical mechanical polishing, etching, and/or the like. The heterostructure barrier layer(s) 14 of the ohmic contact can be selectively formed (e.g., grown, deposited, or the like) on the surface of the semiconductor layer 12. Similarly, each metal layer(s) of the ohmic contact can be selectively formed (e.g., grown, deposited, or the like) in a desired location/configuration using any solution. The area (s) of the surface of the semiconductor layer 12 on which the heterostructure barrier layer(s) 14 and metal layer(s) of the ohmic contact is (are) located can be defined using any solution, e.g., one or more masks, etching, and/or the like. It is understood that the formation of a structure described herein can include one or more additional processing steps, such as the deposit and removal of a temporary layer, such as a masking layer, the formation of a second semiconductor layer 16 (FIG. 2), the formation of a passivation layer 38 (FIG. 4), and/or the like.

The ohmic contacts and corresponding structures described herein can be incorporated as part of various types of devices. To this extent, a device can comprise one or more ohmic contacts, at least one of which is configured according to one of the ohmic contacts described herein. Illustrative devices include a light emitting diode (LED), a laser, a bipolar junction transistor, a heterojunction bipolar transistor, a diode, a photodiode, a switching diode, a thyristor, and the like. In a particular embodiment, the device comprises a nitride semiconductor device. In a more particular embodiment, the nitride semiconductor device comprises a deep ultraviolet light emitting diode for which one or more of the contacts are configured as described herein. Regardless, the remaining components of the device can be formed using any solution. In an embodiment, the device comprises a flip chip device, in which the metal layer(s) of the ohmic contact are bonded to a heat sink for the device.

While shown and described herein as a method of designing and/or fabricating a structure and/or a corresponding semiconductor device including the structure, it is understood that aspects of the invention further provide various alternative embodiments. For example, in one embodiment, the invention provides a method of designing and/or fabricating a circuit that includes one or more of the devices designed and fabricated as described herein.

Figure 12:
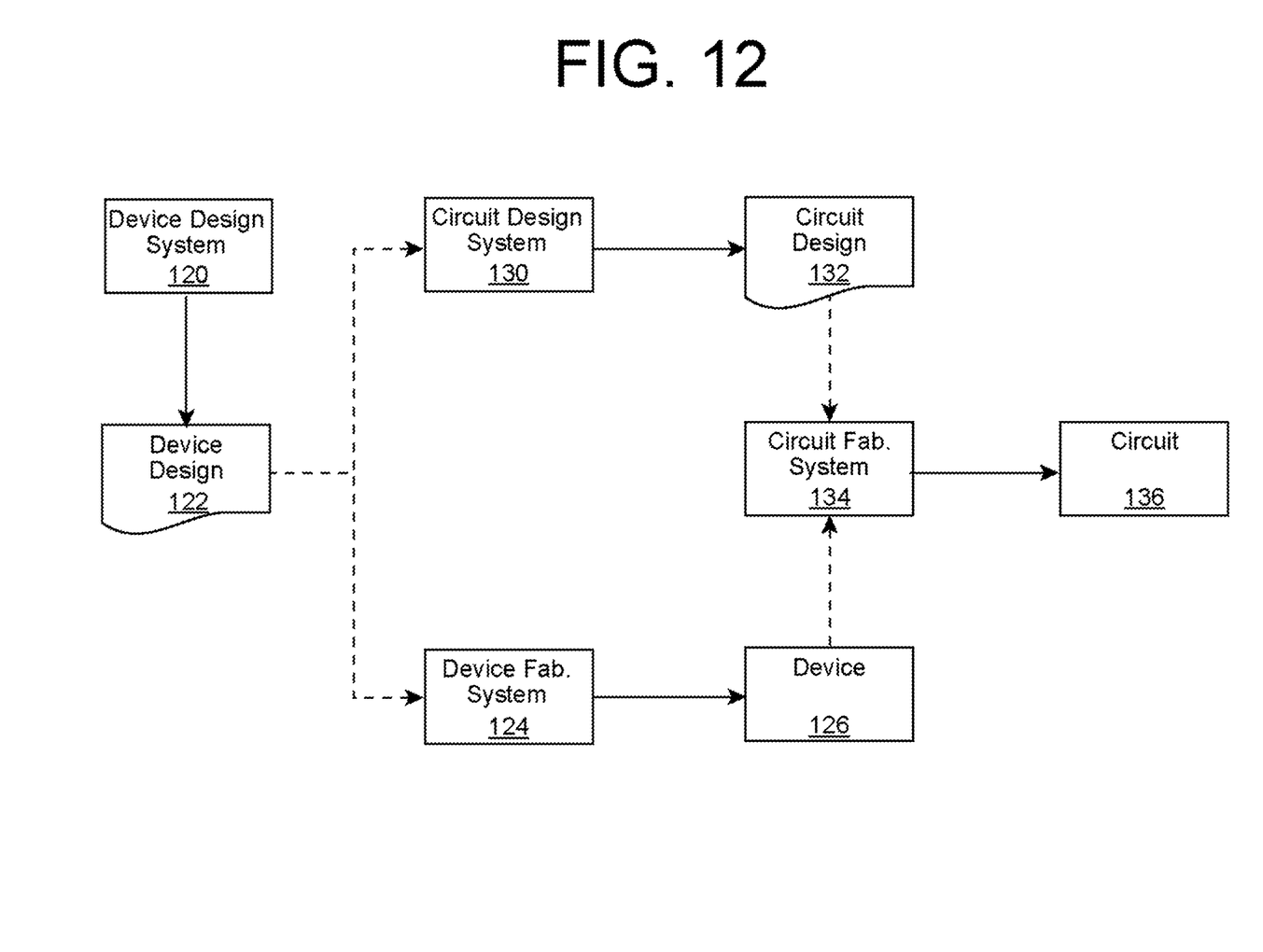
FIG. 12 shows an illustrative flow diagram for fabricating a circuit according to an embodiment.

To this extent, FIG. 12 shows an illustrative flow diagram for fabricating a circuit 136 according to an embodiment. Initially, a user can utilize a device design system 120 to generate a device design 122 as described herein. The device design 122 can comprise program code, which can be used by a device fabrication system 124 to generate a set of physical devices 126 according to the features defined by the device design 122. Similarly, the device design 122 can be provided to a circuit design system 130 (e.g., as an available component for use in circuits), which a user can utilize to generate a circuit design 132 (e.g., by connecting one or more inputs and outputs to various devices included in a circuit). The circuit design 132 can comprise program code that includes a device designed as described herein. In any event, the circuit design 132 and/or one or more physical devices 126 can be provided to a circuit fabrication system 134, which can generate a physical circuit 136 according to the circuit design 132. The physical circuit 136 can include one or more devices 126 designed as described herein.

In another embodiment, the invention provides a device design system 120 for designing and/or a device fabrication system 124 for fabricating a semiconductor device 126 using a method described herein. In this case, the system 120, 124 can comprise a general purpose computing device, which is programmed to implement a method of designing and/or fabricating the semiconductor device 126 as described herein. Similarly, an embodiment of the invention provides a circuit design system 130 for designing and/or a circuit fabrication system 134 for fabricating a circuit 136 that includes at least one device 126 designed and/or fabricated using a method described herein. In this case, the system 130, 134 can comprise a general purpose computing device, which is programmed to implement a method of designing and/or fabricating the circuit 136 including at least one semiconductor device 126 as described herein.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An ohmic contact to a semiconductor layer, the ohmic contact comprising:
   a heterostructure barrier formed on a surface of the semiconductor layer, wherein the heterostructure barrier layer forms a two dimensional free carrier gas for the contact at a heterointerface of the heterostructure barrier layer and the semiconductor layer, the two dimensional free carrier gas extending along the surface of the semiconductor layer beyond a perimeter of the heterostructure barrier layer; and
   a metal layer formed on the heterostructure barrier layer, wherein the metal layer forms a contact with the two dimensional free carrier gas, wherein the metal layer extends directly on all of a top surface and at least one side surface of the heterostructure barrier layer.

2. The ohmic contact of claim 1, wherein the metal layer is formed over at least one part of the two dimensional free carrier gas that extends beyond the perimeter of the heterostructure barrier layer.

3. The ohmic contact of claim 1, where the metal layer extends completely over two side surfaces of the heterostructure barrier layer.

4. The ohmic contact of claim 3, wherein the metal layer directly contacts all of the parts of the two dimensional free carrier gas that extend beyond the perimeter of the heterostructure barrier layer.

5. The ohmic contact of claim 3, wherein the metal layer continues beyond all of the parts of the two dimensional free carrier gas that extend beyond the perimeter of the heterostructure barrier layer onto a portion of the surface of the semiconductor layer that is without direct contact with the two dimensional free carrier gas.

6. The ohmic contact of claim 1, wherein the metal layer that extends completely over the at least one side surface of the heterostructure barrier layer penetrates through the two dimensional free carrier gas into the semiconductor layer.

7. The ohmic contact of claim 1, further comprising a conducting layer formed between the heterostructure barrier layer and the metal layer, wherein the conducting layer comprises a doped semiconductor layer.

8. The ohmic contact of claim 1, wherein the heterostructure barrier layer comprises a graded composition.

9. The ohmic contact of claim 1, wherein the heterostructure barrier layer is at least one of: bulk doped or delta doped.

10. A structure comprising:
    a semiconductor layer; and
    a set of ohmic contact structures, each ohmic contact structure in the set of ohmic contact structures comprising:
    a heterostructure barrier layer formed on a surface of the semiconductor layer, wherein the heterostructure barrier layer forms a two dimensional free carrier gas for the contact structure at a heterointerface of the heterostructure barrier layer and the semiconductor layer, the two dimensional free carrier gas extending along the surface of the semiconductor layer beyond a perimeter of the heterostructure barrier layer; and
    a metal layer located formed on the heterostructure barrier layer, wherein the metal layer forms a contact with the two dimensional free carrier gas, wherein the metal layer extends directly on all of a top surface and at least one side surface of the heterostructure barrier layer.

11. The structure of claim 10, wherein the metal layer is formed over at least one part of the two dimensional free carrier gas that extends beyond the perimeter of the heterostructure barrier layer.

12. The structure of claim 10, where the metal layer extends completely over two side surfaces of the heterostructure barrier layer.

13. The structure of claim 12, wherein the metal layer directly contacts all of the parts of the two dimensional free carrier gas that extend beyond the perimeter of the heterostructure barrier layer.

14. The structure of claim 12, wherein the metal layer extends beyond all of the parts of the two dimensional free carrier gas that extend beyond the perimeter of the heterostructure barrier layer onto a portion of the surface of the semiconductor layer that is without direct contact with the two dimensional free carrier gas.

15. The structure of claim 10, wherein the metal layer that extends completely over the at least one side surface of the heterostructure barrier layer penetrates through the two dimensional free carrier gas into the semiconductor layer.

16. The structure of claim 10, wherein the two dimensional free carrier gas is continuous and extends along the heterointerface of the heterostructure barrier layer of each ohmic contact structure and the semiconductor layer.

17. The structure of claim 10, wherein the two dimensional free carrier gas comprises a plurality of distinct regions of two dimensional free carrier gases, each distinct region of two dimensional free carrier gas extending along a heterointerface of a heterostructure barrier layer of a respective ohmic contact structure and the semiconductor layer.

18. The structure of claim 10, wherein the set of ohmic contact structures includes a plurality of ohmic contact structures forming a patterned structure.

19. The structure of claim 10, wherein at least one of the heterostructure barrier layer or the semiconductor layer comprises a group III nitride-based layer.

20. The structure of claim 10, wherein at least one of the heterostructure barrier layer or the semiconductor layer comprises a superlattice with a periodic variation of composition or a superlattice with an aperiodic variation of composition varying from period to period.

21. A method comprising:
  forming an ohmic contact to a semiconductor layer, the ohmic contact comprising:
    a heterostructure barrier formed on a surface of the semiconductor layer, wherein the heterostructure barrier layer forms a two dimensional free carrier gas for the contact at a heterointerface of the heterostructure barrier layer and the semiconductor layer, the two dimensional free carrier gas extending along the surface of the semiconductor layer beyond a perimeter of the heterostructure barrier layer; and
    a metal layer formed on the heterostructure barrier layer, wherein the metal layer forms a contact with the two dimensional free carrier gas, wherein the metal layer extends directly on all of a top surface and at least one side surface of the heterostructure barrier layer.

* * * * *